(12) United States Patent
Karsenti

(10) Patent No.: US 7,764,824 B2
(45) Date of Patent: Jul. 27, 2010

(54) METHOD FOR DEFECT DETECTION AND PROCESS MONITORING BASED ON SEM IMAGES

(75) Inventor: Laurent Karsenti, Rehovot (IL)

(73) Assignee: Applied Materials Israel, Ltd., Rehovot (IL)

( * ) Notice: Subject to any disclaimer, the term of this patent is extended or adjusted under 35 U.S.C. 154(b) by 940 days.

(21) Appl. No.: 10/564,846

(22) PCT Filed: Jul. 15, 2004

(86) PCT No.: PCT/US2004/023024

§ 371 (c)(1),
(2), (4) Date: Jun. 30, 2006

(87) PCT Pub. No.: WO2005/008223

PCT Pub. Date: Jan. 27, 2005

(65) Prior Publication Data

US 2006/0251340 A1    Nov. 9, 2006

Related U.S. Application Data

(60) Provisional application No. 60/488,561, filed on Jul. 18, 2003.

(51) Int. Cl.
*G06K 9/00* (2006.01)
(52) U.S. Cl. ........................ 382/145; 348/92
(58) Field of Classification Search .......... 382/100, 382/141, 144, 145, 146, 147, 149; 438/16; 29/833; 348/86, 87, 92, 125, 126, 129
See application file for complete search history.

(56) References Cited

U.S. PATENT DOCUMENTS

| 4,484,081 A | 11/1984 | Cornyn, Jr. et al. |
| 5,513,275 A | 4/1996 | Khalaj et al. |
| 6,122,397 A | 9/2000 | Nelson et al. |
| 6,330,354 B1 | 12/2001 | Companion et al. |

(Continued)

FOREIGN PATENT DOCUMENTS

EP    1 146 481    10/2001

OTHER PUBLICATIONS

Chetverikov, Finding defects in texture using regularity and local orientation, 2002, Elsevier Pattern Recognition vol. 35, Issue 10, pp. 2165-2180.*

(Continued)

*Primary Examiner*—Anand Bhatnagar
(74) *Attorney, Agent, or Firm*—Sonnenschein Nath & Rosenthal LLP

(57) ABSTRACT

A morphological operation is applied to an SEM image to obtain a idealized image, and the idealized image is used to detect a defect in a subject of the SEM image. The defect is detected by subtraction of the idealized image from the original image. Morphological operations are used also to entrance the visibility of defects or to check for irregularities in patterns. Other described methods comprise: growing a flow from seed points in the image, in order to define maps in which particles can be identified; checking for separation of objects in the image by growing flows from seed points located on the objects; segmenting the image into supposed identical objects and applying statistical methods to identify the defective ones.

9 Claims, 6 Drawing Sheets

U.S. PATENT DOCUMENTS

2001/0036306 A1    11/2001   Wienecke
2003/0076989 A1     4/2003   Maayah et al.

OTHER PUBLICATIONS

Gonzalez, Digital Image Processing, 2001, Prentice Hall, 2 ed, pp. 525, 527.*

International Search Report, Applied Materials Israel, Ltd., May 11, 2005, 9 pp.

Xianghong Zhao et al., Automated Image Analysis for Applications in Reservoir Characterization, Knowledge-Based Intelligent Engineering Systems and Allied Technologies, 2000. Proceedings, fourth int. conference on Brighton, UK., Aug. 30-Sep. 1, 2000, 4pp.

Gongyuan Qu et al., Wafer Defect Detection Using Directional Morphological Gradient Techniques, Eursasip Journal on Applied Signal Processing Hindawi USA, vol. 2002, No. 7, 18p.

* cited by examiner

Area Growing

METHOD FOR DEFECT DETECTION AND PROCESS MONITORING BASED ON SEM IMAGES

CROSS REFERENCES TO RELATED APPLICATIONS

The present patent application is a national phase application of International Application No. PCT/US2004/023024 filed Jul. 15, 2004, which claims priority benefit from U.S. Provisional Application 60/488,561 filed Jul. 18, 2003.

BACKGROUND

SEM images are commonly used in semiconductor processing operations, for example as inspection tools. However, analyzing such images to locate defects in the wafers dies or other items under inspection is often difficult. Therefore, it would be desirable to have improved methods for detecting such defects.

SUMMARY OF THE INVENTION

In one embodiment, a morphological operation is applied to an SEM image to obtain a idealized image, and the idealized image is used to detect a defect in a subject of the SEM image. Details of the original image may be removed in the idealized image and the defect detected by image comparison between the SEM image and the idealized image. Such image comparison may include a subtraction such that an image obtained after the morphological operation reveals only details that have been removed by the morphological operation.

In a further embodiment, a sequence of morphological operations are applied to an image, the morphological operations making use of structuring elements that match or do not match some morphological properties of a pattern present in the image, and defects in a subject of the image are detected as a consequence of some of said patterns being modified by the morphological operations while others are not.

Still a further embodiment provides for applying a morphological operation to an SEM image to obtain a idealized image, and using the idealized image to enhance a feature of a subject of the SEM image.

Yet another embodiment permits applying, as an image preprocessing operation, a morphological operation to an SEM image to obtain a resulting image that is a modification of SEM image in which a defect in a subject of the SEM image is more easily detectable that in the SEM image.

Still a further embodiment of the present invention involves detecting a small particle located in a uniform background of an image by defining a seed point in each part of the image that needs to be inspected, growing a flow from each seed point by merging pixels which satisfy specified conditions about their similarity, and creating a map therefrom. A hole in the map may be used to identify an irregularity in a texture of the inspected part of the image.

In yet another embodiment of the present invention, object segmentation is performed on an image that includes a large number of assumed to be identical objects to create a segmentation map, specific areas of interest relative to the segmentation map are defined and for each such area a measurement is performed. Defects in the subject of the image may be located according to whether or not the observed measurements are statistically anomalous.

Still another embodiment of the present invention provides for applying a morphological operation to an SEM image to obtain a idealized image, for each object in the image that needs to be analyzed for separation defining a seed point and growing said seed points until they meet.

BRIEF DESCRIPTION OF THHE DRAWINGS

The present invention is illustrated by way of example, and not limitation, in the figures of the accompanying drawings, in which.

DETAILED DESCRIPTION

Figures 1A, 1B, 1C, 1D:
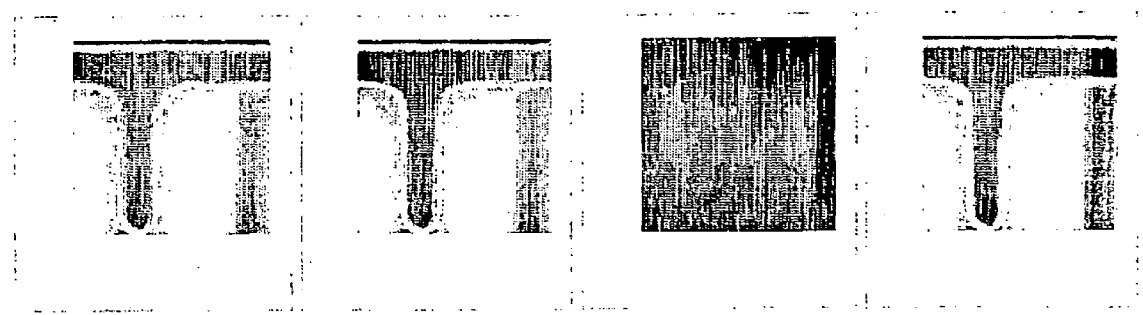
FIGS. 1a-1d illustrate an example of the use of defect detection using a morphological approach in accordance with an embodiment of the present invention.

Described herein are various methods for defect detection and process monitoring based on images obtained using scanning electron microscopes (SEMs). In the following description, for purposes of explanation, numerous specific details are set forth in order to provide a thorough understanding of the present invention. It will be evident, however, to one skilled in the art that the present invention may be practiced without these specific details. In some instances, well-known known structures and devices are shown in block diagram form, rather than in detail, in order to avoid obscuring the present invention. These embodiments are described in sufficient detail to enable those skilled in the art to practice the invention, and it is to be understood that other embodiments may be utilized and that logical, mechanical, electrical, and other changes may be made without departing from the scope of the present invention.

Some portions of the detailed descriptions that followed are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, signals, datum, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention can be implemented by an apparatus for performing the operations herein. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and processes presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor or by any combination of hardware and software. One of skill in the art will immediately appreciate that the invention can be practiced with computer system configurations other than those described below, including hand-held devices, multiprocessor systems, microprocessor-based or programmable consumer electronics, DSP devices, network PCs, minicomputers, mainframe computers, and the like. The invention can also be practiced in distributed computing environments where tasks are performed by remote processing devices that are linked through a communications network. The required structure for a variety of these systems will appear from the description below.

The methods of the invention may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, etc.), as taking an action or causing a result. Such expressions are merely a shorthand way of saying that execution of the software by a computer causes the processor of the computer to perform an action or produce a result.

A. Defect Detection using Morphological Approach

In accordance with one embodiment of the present invention, an SEM image is processed using a morphological operation. Morpohlogical image processing may be regarded generally, as binary or other (e.g., grayscale) image processing using shift-invariant (translation invariant) operators. Examples of morphological operations include erosion, dilation, opening, closing, shrinking, thinning, thickening, skeletonization, and pruning. Applications of these techniques include the detection of image elements, image segmentation, image filtering, granulometry and distance transforms. Particular examples of morphological operations which can be used in accordance with the present invention are described in Luc Vincent, "Morphological Area Opening and Closing for Grayscale Images", *Proc. NATO Shape ill Picture Workshop*, Driebergen, The Netherlands, pp. 197-208, September 1992, and available at http://www.vincent-net.com/luc/papers/, incorporated herein by reference. Descriptions of image reconstruction using pre-defined structuring elements but based on OM images are described at http://www.mmorph.com/html/mmdemos/mmdlith.html, incorporated herein by reference.

As shown in FIGS. 1a-1d, an original SEM image (FIG. 1a) may undergo morphological image processing to derive a resulting image (FIG. 1b). The resulting image is an idealization of the original image in the sense that some details of the original image are removed. Image comparison (e.g., by subtraction) between the original image and the idealized image (i.e., the image obtained after the morphological operation) reveals only the details that have been removed by the morphological operation (see FIG. 1c). FIG. 1d illustrates the use of a thresholding operation. By properly selecting the morphological operation it is possible to achieve very efficient (e.g., in terms of throughput/sensitivity) methods for defect detection and process control. The examples shown in FIGS. 1a-1d are based on the Area Close Algorithm.

The advantages of this approach over die-to-die or cell-to-cell images comparison are:
 a. No need to perform registration.
 b. Single image generation (throughput).
 c. Process variation between dies or cells does not limit the sensitivity.
 d. The present approach can be used for monitoring a process before maturity.
 e. Image variations (e.g., focus, gain, illumination variations) inherent to the generation of separate images is no longer an issue.

B. Good/Bad Pattern Classification Based on Morphological Operation

Figure 2:
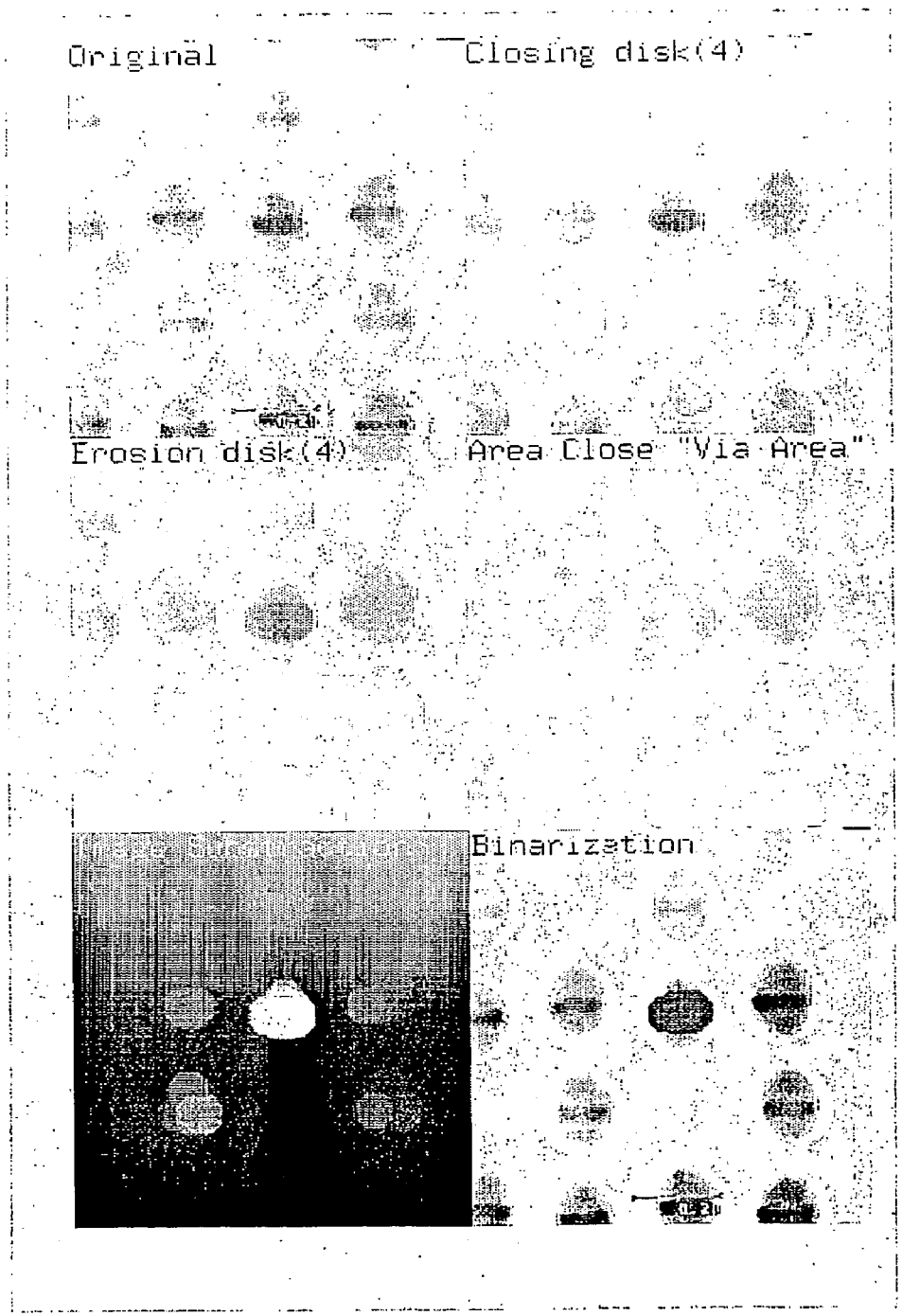
FIG. 2 illustrates an example of the use of good/bad pattern classification based on a morphological operation in accordance with an embodiment of the present invention.

In this embodiment of the present invention a sequence of morphological operations is applied to an image. The morphological operations make use of structuring elements that match or do not match some morphological properties of the pattern present in the image. As a consequence some patterns are modified by the operations while others are not. In the example shown in FIG. 2 the presence of a large dark band area in the center of the hole indicates a failure in the process. The critical dimension of the process (maximum dark band width) dictates the radius of the structuring element (kernel) used for the morphological operation (close). Similarly processing the image by a structuring element smaller or equal to the minimum distance between objects will reveal the presence of a defect.

C. Object Identification/Segmentation Using Morphological Operation

Figures 3A, 3B, 3C:
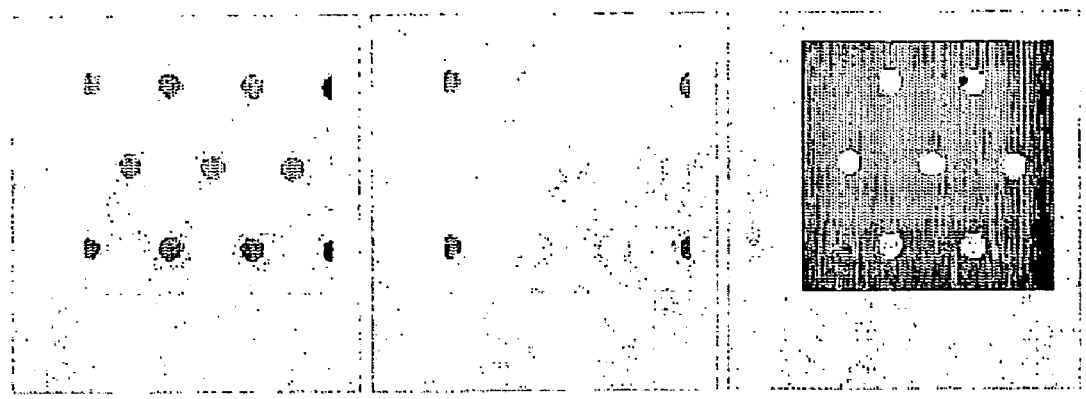
FIGS. 3a-3c illustrate an example of the use of object identification/segmentation using a morphological operation in accordance with an embodiment of the present invention.

Morphological operators (see examples from the references cited above) are used to identify objects presenting some morphological properties, for example:
 a. area within a specific range
 b. contrast (larger or smaller than a specific contrast)
 c. volume defined as the product between the contrast and the area
 d. 1-D critical dimension
 e. 2-D critical dimension In the example shown in FIGS. 3a-3c, this property is used to enhance the selected objects (holes) present in the image.

The image difference (FIG. 3c) is produced by subtracting the morphological close image (FIG. 3b) from the original SEM image (FIG. 3a).

D. Defect Enhancement by Morphological Operation

In this embodiment of the present invention morphological operations are used as a pre-processing operation. The goal is to modify the original SEM image in order to make the defect more easily detectable. One of the properties of the morphological operators is their ability to transform edge information into bulk information. This property is particularly interesting when the pattern to analyze is bounded by an edge that contains the information (e.g., gray level variation observed in case of voltage contrast). In traditional image subtraction detection methods, the edge of the pattern cannot be accurately analyzed because of edge location inaccuracy between the two images.

Figures 4A, 4B:
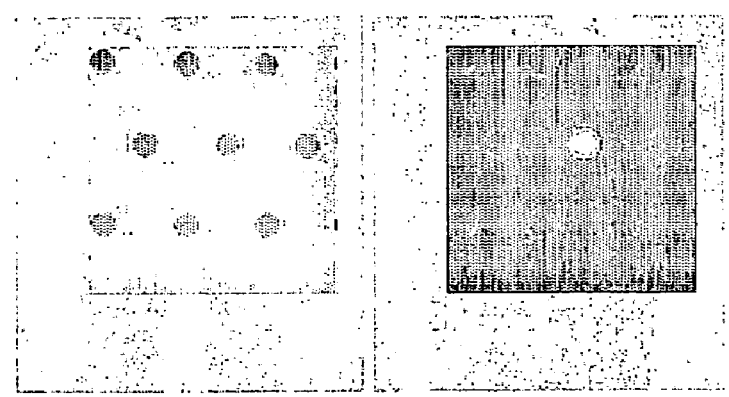
FIGS. 4a and 4b illustrate an example of defect enhancement using a morphological operation in accordance with an embodiment of the present invention.

The images shown in FIGS. 4a and 4b show an example. FIG. 4a shows the original image, while FIG. 4b shows the image after morphological enhancement. Note that the defect shows up clearly in this latter image.

E. Defect Detection by Region Growing.

In this embodiment of the present invention, an algorithm configured to detect very small particle located in a uniform background is used. A seed point is defined in each part of the image that needs to be inspected. From each seed point a "region growing flow" is defined that merges pixels which satisfied specified conditions about their similarity (e.g., gray/gradient, etc.). The resulting map created after merging (growing) is analyzed: The presence of a hole reveals the presence of an irregularity in the texture of the inspected part of the image (i.e., a defect). Metrics such as an included bounding box or bounding rectangle can be defined lead to metrology.

Figure 5:
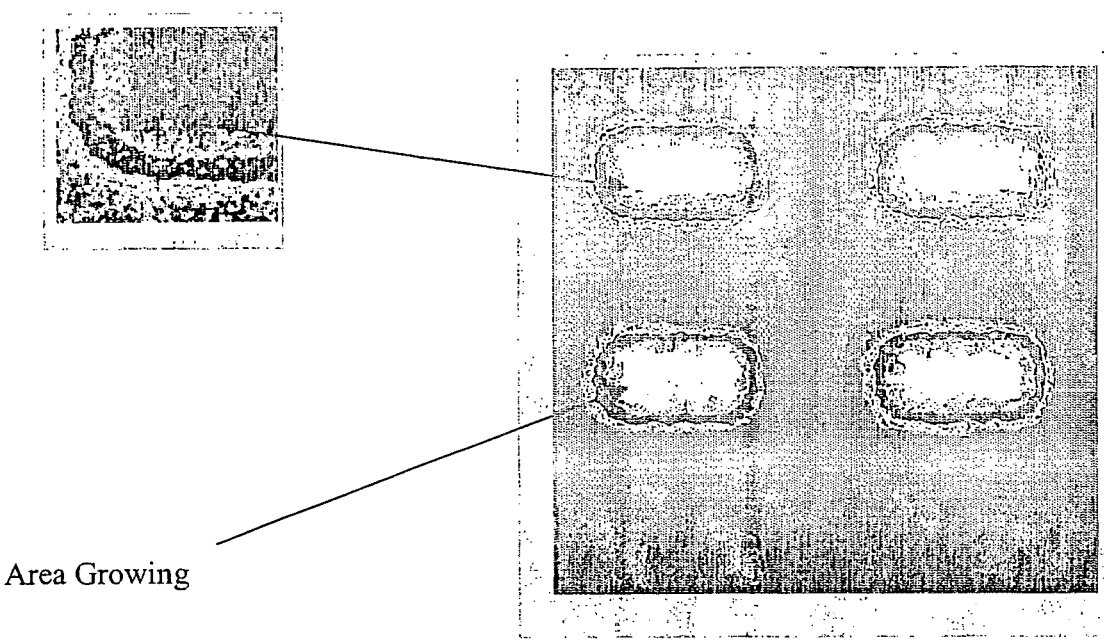
FIG. 5 illustrates an example of defect detection by region growing in accordance with an embodiment of the present invention.

FIG. 5 illustrates an example of this method in which a 30 nm defect is identified. The original image is located at the left of the illustration and the enlargement on the right shows an expanded view of the area of interest. From a seed point, certain region growing flows (in this example, four such flows) have been grown and defects uncovered. Each of the growth areas may be analyzed separately as part of this procedure.

F. Defect Detection Based on Statistic Analysis

In this embodiment, an image adapted to include a large number of assumed identical objects is used. The principle for this method is as follows:
  a. Perform object segmentation (see segmentation details).
  b. Define specific area(s) of interest relative to the segmentation map (these areas are referred to as "Blobs").
  c. For each Blob, perform some measure (see measures details).
  d. Assuming the objects are identical, the observed measures should be normally distributed (i.e., should fall within a normal distribution of variations).
  e. Any measure showing deviation from the normal distribution reveals an invalid object (i.e., a defect).

This method has the advantage of being insensitive to image variation (e.g., DC, gain, etc.). Similar methods can be defined where, instead of using a statistical approach, measures are compared to fixed thresholds or combination thereof.

Segmentation details: The segmentation can be performed on images generated or collected using a special setting that is not sensitive to the specific measures. This is the case in the SEMVision (available from Applied Materials Inc.) where the external perspective is sensitive to the topography contrast while the internal perspective is sensitive to material contrast.

Measures details: The measure can be gray level of the input image or any other metric of interest calculated on the original image for the region defined by the blob: (e.g., texture, min, max, gray level uniformity, etc.). The measure can be made on any other image transformation that reveals the attribute that needs to be measured (e.g., difference image between morphological idealization and original image). The measure can be made on any geometrical feature (e.g., size, radius, etc.).

Figure 6:
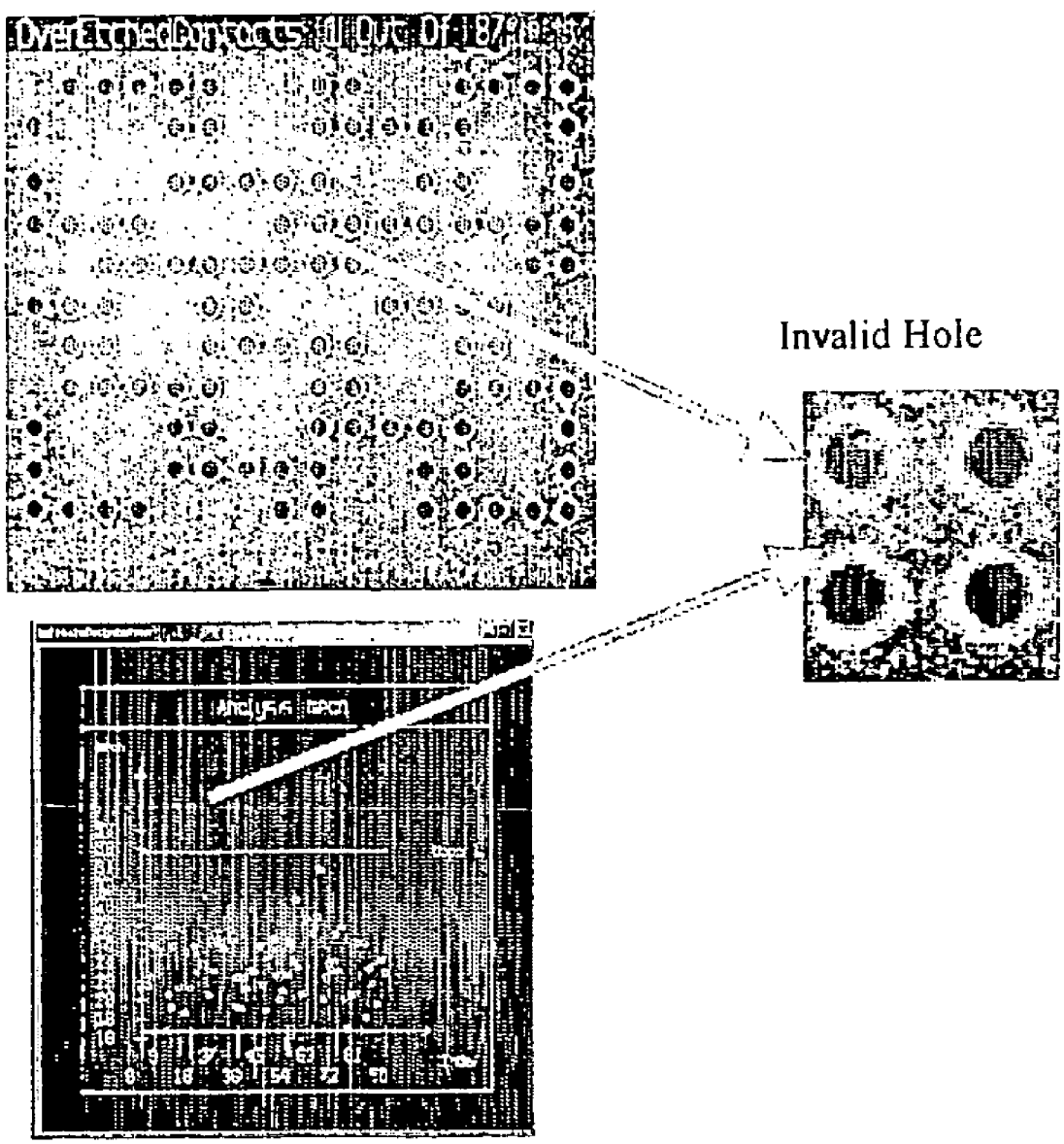
FIG. 6 illustrates an example of defect detection based on statistic analysis in accordance with an embodiment of the present invention.

FIG. 6 illustrates an example of this method. The measure is performed on each inner part of the hole (the blob in this example). In this case, the measure is the mean gray level by blob.

G. Defect Detection based on Flooding Approach

In this embodiment an algorithm designed to identify if two (or more) objects are separated or not (bridge defect) is used. This flow assumes that the SEM is able to generate an image on a known location where the content of the image (e.g., position of the pattern) is known. For each object of the image that needs to be analyzed for separation, a seed point is defined. Some extra seed points are located on the background part of the image. Seed points are grown until they meet (e.g., using An algorithm called Watershed based on marker). If the objects are well separated, the regions defined by their seed point will never meet, the), should only meet regions defined by the background seed marker.

Figure 7:
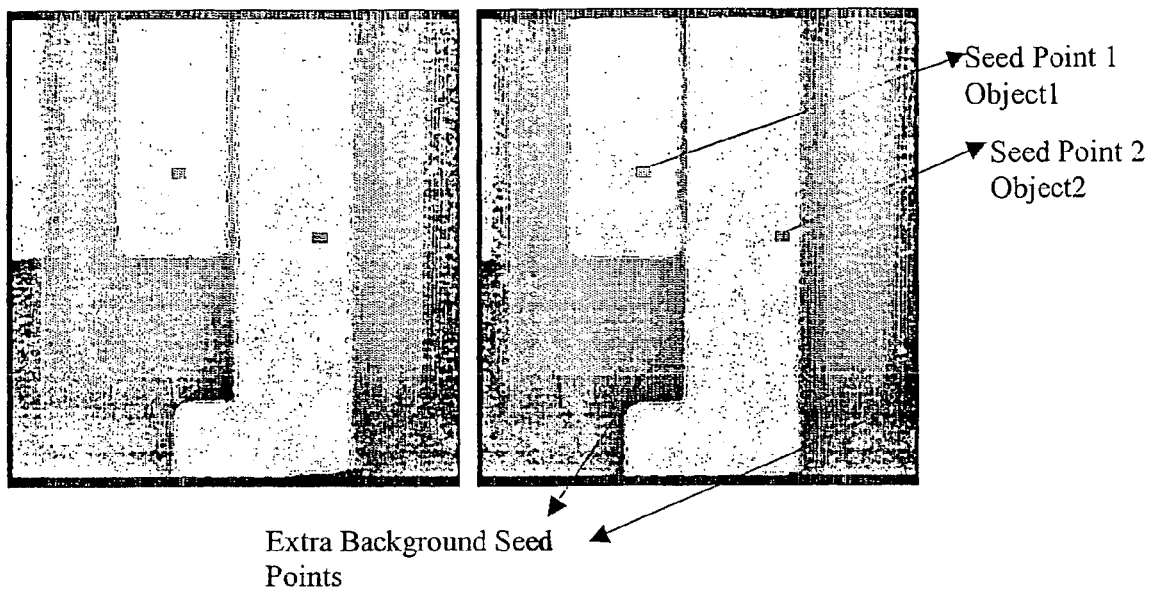
FIG. 7 illustrates an example of the use of defect detection based on a flooding approach in accordance with an embodiment of the present invention.

The Watershed algorithm is described in L. Vincent & P. Soille, "Watersheds in digital spaces: an efficient algorithm based on immersion simulations", *IEEE Trans. Pattern Analysis and Machine Intelligence*. 13:583-598, 1991; and R. Lotufo & A. Falcao, "The ordered queue and the optimality of the watershed approaches", in J. Goutsias and L. Vincent and D. Bloomberg, editors, *Mathematical Morphology and its Application to Image and Signal Processing*, (Computational Imaging and Vision, vol. 12), pages 341-350. Kluwer Academic Publishers, Dordrecht, 2000, each incorporated herein by reference. FIG. 7 illustrates an example. After growing the seed points are merged to create the lines seen in the illustration on the left.

Thus, various methods for defect detection and process monitoring based on images obtained using scanning electron microscopes have been described. Although discussed with reference to certain illustrated embodiments, however, the present invention should only be measured in terms of the claims that follow.

What is claimed is:

1. A method, comprising applying, by a processor and as an image preprocessing operation according to computer-executable instructions stored in a computer-readable storage device communicatively coupled to the processor, a morphological operation to an SEM image to obtain a resulting image that is a modification of SEM image in which a defect in a subject of the SEM image is more easily detectable that in the SEM image, wherein the morphological operation makes use of a structuring element that is at least one of smaller and equal to a minimum distance between objects in the SEM image.

2. The method of claim 1, wherein the defect is detected by image comparison between the SEM image and the resulting image.

3. The method of claim 2, wherein the image comparison comprises subtraction.

4. The method of claim 2, wherein the comparison comprises a thresholding operation.

5. The method of claim 1, wherein the morphological operation comprises at least one of: erosion, dilation, opening, closing, shrinking, thinning, thickening, skeletonization, and pruning.

6. The method of claim 1, wherein the morphological operation comprises a sequence of morphological operations.

7. The method of claim 1, wherein the morphological operation makes use of structuring elements that match one or more morphological properties of a pattern present in the SEM image.

8. The method of claim 1, wherein the morphological operation makes use of structuring elements that do not match one or more morphological properties of a pattern present in the SEM image.

9. The method of claim 1, wherein at least some patterns present in the SEM image are modified by the morphological operation while other patterns present in the SEM.

* * * * *